United States Patent [19]
Wikborg et al.

[11] Patent Number: 5,831,279
[45] Date of Patent: Nov. 3, 1998

[54] DEVICE AND METHOD PROVIDING WEAK LINKS IN A SUPERCONDUCTING FILM AND DEVICE COMPRISING WEAK LINKS

[75] Inventors: Erland Wikborg, Danderyd, Sweden; Evgeni Stepantsov, Moscow, Russian Federation; Zdravko Ivanov, Göteborg; Tord Claeson, Mölndal, both of Sweden

[73] Assignee: Telefonktiebolaget LM Ericsson, Stockholm, Sweden

[21] Appl. No.: 434,194

[22] Filed: May 3, 1995

[30] Foreign Application Priority Data

May 3, 1994 [SE] Sweden .................. 9401530-2

[51] Int. Cl.$^6$ .............. H01L 29/06; H01L 39/22; H01L 31/0256; H01B 12/00
[52] U.S. Cl. ................ 257/34; 257/28; 257/32; 257/35; 505/233; 505/234; 505/237; 505/239
[58] Field of Search .................. 257/28, 31–35; 505/233–234, 237, 239

[56] References Cited

U.S. PATENT DOCUMENTS

| | | | |
|---|---|---|---|
| 4,980,341 | 12/1990 | Gehring ................ | 501/1 |
| 5,278,140 | 1/1994 | Chaudhari et al. .......... | 505/1 |
| 5,339,457 | 8/1994 | Kawasaki et al. ......... | 455/333 |
| 5,472,934 | 12/1995 | Akoh et al. ............. | 505/190 |

FOREIGN PATENT DOCUMENTS

WO92/15406  9/1992  WIPO.

OTHER PUBLICATIONS

P. Chaudhari et al., "Direct Measurement of the Superconducting Properties of Single Grain Boundaries in $Y_1Ba_2Cu_3O_{7-\delta}$," Physical Review Letters, vol. 60, No. 16, pp. 1653–1656 (Apr. 18, 1988).

P.G. Quincey, "High $T_c$ Josephson junctions combining a grain boundary and local strain, using $NdGaO_3$ bicrystal substrates," Appl. Phys. Lett., vol. 64, No. 4, pp. 517–519 (Jan. 24, 1994).

E.A. Stepantsov et al., "On the Possibility of Usage of Crystalline Composites in Investigations of High–$T_c$ Superconductivity," Physica Scripta, vol. 44, pp. 102–104 (1991).

N. Tomita et al., "Preparation of Bycrystal in a Bi–Sr–Ca–Cu–O Superconductor," Japanese Journal of Applied Physics, vol. 29, No. 1, pp. L30–L32 (Jan. 1990).

*Primary Examiner*—Olik Chaudhuri
*Assistant Examiner*—Howard Weiss
*Attorney, Agent, or Firm*—Burns, Doane, Swecker & Mathis, L.L.P.

[57] ABSTRACT

A device with weak links (Josephson junctions) in a superconducting film has two single crystals connected through an interconnecting arrangement that may have one or more sublayers. At least two grain boundaries or at least one barrier are/is formed in the substrate.

26 Claims, 3 Drawing Sheets

DEVICE AND METHOD PROVIDING WEAK LINKS IN A SUPERCONDUCTING FILM AND DEVICE COMPRISING WEAK LINKS

BACKGROUND

The present invention relates to a device providing weak links in a superconducting film comprising a substrate. The substrate comprises two single crystals which are interconnected via an interconnecting arrangement. The invention also relates to a method for producing weak links or Josephson junctions in a superconducting film comprising two or more single crystals.

Josephson junctions or weak links are fundamental elements in the field of superconducting microelectronics etc. However, so called Josephson devices have up to now not been used in the large number of applications as would have been expected. The most important reason therefore is that their use is restricted due to the fact that up to now generally low temperature superconducting materials have had to be used. The use of low temperature superconducting materials is however restricted by complicated techniques for reaching the low temperatures in question as well as it involves high costs. Furthermore, generally the techniques used for producing Josephson junctions in low temperature superconducting materials can not be applied to high temperature superconducting materials denoted high $T_c$-materials, the critical temperature, $T_c$, being the temperature at which a phase transition from a state of normal electrical resistivity to a superconducting state takes place. Particularly it has shown to be very difficult to make Josephson junctions using high temperature super-conducting (HTS) materials because of their short coherence length and because of the sensitivity of these materials to any technological treatment necessary to form the Josephson junctions at a temperature which is as high as possible.

Arrangements are known wherein Josephson junctions can be produced from grain boundaries in a substrate in a controlled way.

In 'Direct Measurement of the Superconducting Properties of Single Grain Boundaries in $Y_1Ba_2Cu_3O_{7-\delta}$,' by P. Chaudhari et al., Physical Review Letters Vol. 60, No. 16, 18.4.1988, a device is shown wherein HTS films with a single grain boundary junction grown from crystal substrates consisting of two single crystals are connected to each other by an integranular grain boundary. During the growth of the HTS film on the substrate, the HTS film inherits the grain boundary from the substrate wherein the grain boundary acts as a Josephson junction i.e. a potential barrier for one-electron and Cooper pair-electron transport, i.e. a decrease in the critical supercurrent.

However, this arrangement comprising a single grain boundary film can in practice not be used for making integrated circuits since all Josephson elements have to been lined up along the grain boundary which only makes semi-one-dimensional circuits possible. Under optimal conditions the transport properties of the barrier depend only on the misorientation angle between the two parts of the bicrystal and the critical current ($I_c$) can not be depressed more than about 3 orders of magnitude.

In "On the possibility of Usage of Crystalline Composites in Investigations of High-$T_c$ superconductivity" by E A Stepantsov and A. Y. Tzalenchuk, Physica Scripta, vol 44, p 102 (1991), is referred to parallel rows of grain boundaries which however cannot be obtained in the manner desired as to reproducibility which is necessary for a number of applications etc.

In WO-A-92 15406 a weak link device is shown. Crystallographic boundary junctions are created by forming an epitaxial film on a crystalline substrate having intersecting faces. E.g. a "V"-grove or a step is etched in a face of a single crystal substrate whereafter an epitaxial superconducting film is grown on the substrate. Grain boundary junctions are then formed at the points of intersection of the faces with one another or with the faces and surface of the substrate. Hence it is fundamental for the functioning of the invention described in said document that there are non-parallel, intersecting faces to produce the grain boundary junctions and consequently the weak links. However the device as described in the document can be difficult to reproduce and the structure is undefined. Moreover it has to be provided with grooves or steps or similar which always involves complications to some extent and if a uniform arrangement is desired it is difficult to arrange the steps or grooves in such a manner. Moreover it is not possible to arrange a number of uniformly arranged parallel grain boundaries in series. Not more than three parallel grain boundaries can be arranged corresponding to the intersecting faces of the groove and the intersection of their faces with the surface of the single crystal since there necessarily has to be a distance between each groove i.e. it is not possible to arrange them as close as it could be desired or immediately after one another but on the contrary there has to be a considerable distance between consecutive grooves.

SUMMARY

It is an object of the present invention to provide a device providing weak links (Josephson junctions) in a superconducting film, comprising a substrate comprising two interconnected single crystals. It is also an object to provide a device comprising a substrate comprising two single crystals which are interconnected and a superconducting film with weak links, wherein the grain boundaries are easily reproducible and wherein grain boundaries can be obtained parallelly. It is a further object of the invention to provide a device wherein the grain boundaries can be obtained in parallel in a desired number. Still another object of the present invention is to provide grain boundaries which can be more or less closely arranged to increase the number of barriers in a deposited superconducting film. In a further aspect of the invention it is possible to increase the barrier thickness in a deposited film in the sense that a number of very closely arranged Josephson junctions work as one thick barrier in practice. Another object of the invention is to provide a device or a substrate for a multi-grain boundary film. A particular object of the invention is to provide a device wherein weak links or Josephson junctions can be obtained in a high temperature superconducting film.

The array of grain boundary junctions can be realized using a substrate with several sections of different thicknesses formed by using a multilayer of films deposited on the surface(s) before joining or formed by fusing several thin slabs typically of a thickness of approximately 10 $\mu$m (each) together.

Therefore a device is provided which has an interconnecting arrangement which comprises one or more layers. At least two grain boundaries are formed in the substrate. In a further aspect at least one barrier is formed in the substrate.

Particularly the grain boundaries are obtained without any intersecting surfaces of the substrate or the single cristals.

The invention further relates to a method for fabrication of a device or a substrate with multi-grain boundaries which can be obtained in a superconducting film deposited thereon.

This is achieved through interconnecting single crystals so as to provide grain boundaries and arranging the single crystals and the interconnecting arrangement so that a surface in substantially one plane is formed and depositing a superconducting film on the surface so that the superconducting film inherits the grain boundaries of the substrate, providing Josephson-junctions.

BRIEF DESCRIPTION OF THE DRAWINGS

The invention will in the following be further described under reference to the accompanying drawings in an explanatory and by now means limiting way, wherein:

FIG. 3b illustrates a HTS-film deposited on the substrate of FIG. 3a.

DETAILED DESCRIPTION

Figure 1A:
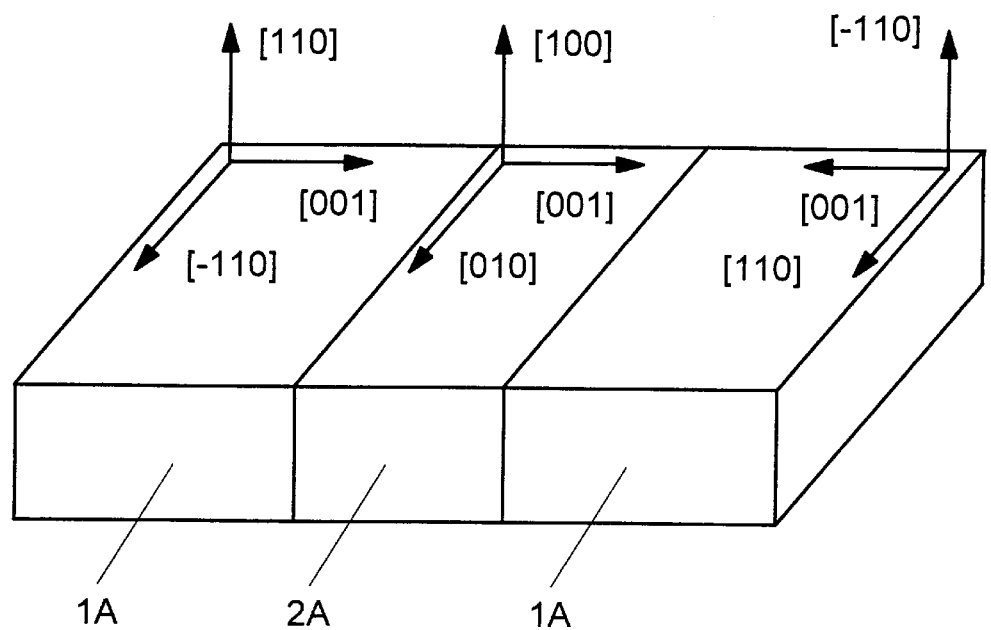
FIG. 1a illustrates a substrate comprising two single crystals interconnected through a seam layer.

In FIG. 1a a substrate is illustrated which comprises two single crystals 1A,1A. The single crystals can e.g. be made of Y—$ZrO_2$. A number of different materials can be used. However, advantageously a material is used which is suitable for growth of high temperature superconducting films thereon. According to further embodiments the single crystals can e.g. be made of $NdGaO_3$. In still further embodiments a single crystal can be made of $SrTiO_3$, MgO, sapphire or similar. The dimension of the single crystals 1A,1A need not be specified but some dimensions are given for exemplifying reasons. The dimensions may e.g. be 5×10×0.5 millimeters. These dimensions are however in no way to be seen as limitative, they might e.g. be increased up to two to three times or similar, or anything therebetween. Of course they may also be decreased about two or three times, it however generally being of greater interest to make them somewhat bigger. This depends on intended application, fabrication and used techniques etc.

Figure 1B:
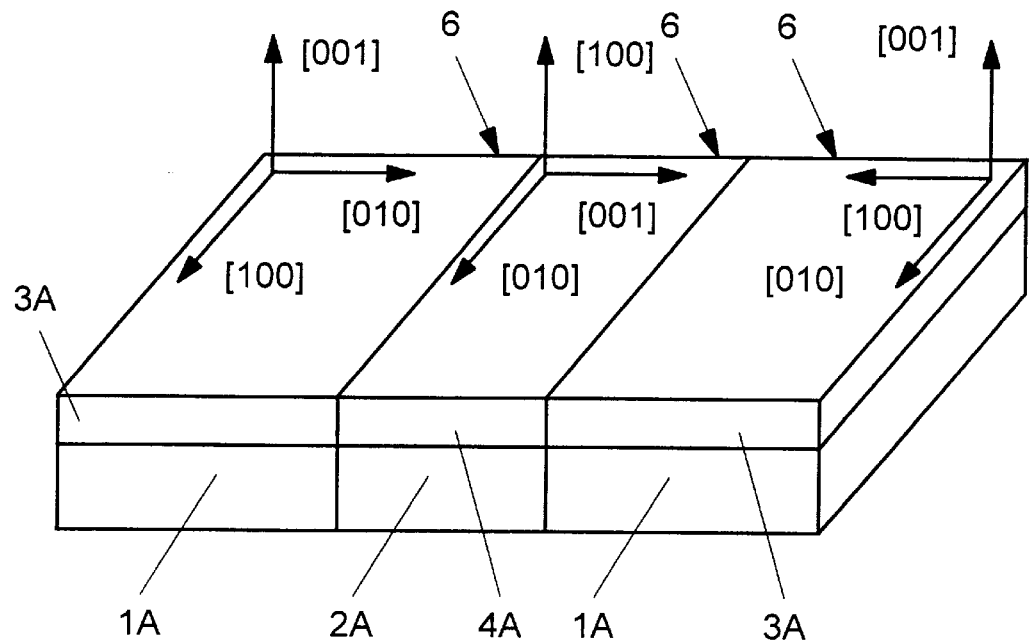
FIG. 1b illustrates a substrate according to FIG. 1a with a HTS film deposited thereon.

On a polished side of each of the two single crystals 1A,1A an YBCO film is deposited. This film may e.g. have a thickness of about 250–500 nm. This is however merely given as an example for a particular embodiment and depends on the particular requirements, needs and conditions which are relevant to the particular device. The films can be of any other appropriate material which will be further discussed later on. In FIG. 1a is shown when the interconnecting arrangement 2A comprising the two films (not explicitly indicated) have already been joined. The interconnecting arrangement 2A in this case comprises a 1000 nm YBCO seamlayer. The crystallographic axes of the single crystals 1A (in this case $NdGaO_3$) and the interconnecting arrangement 2A are illustrated by the brackets in the figure. In the described embodiment the single crystals have the orientation [110] perpendicular to the plane of the substrate whereas the interconnecting arrangement 2A or the seamlayer has the orientation [100] perpendicular to the plane of the substrate. In FIG. 1b a thin film 6 of e.g. YBCO is deposited on the substrate. The film 6;3A,4A is grown with the orientation [001], 3A, perpendicular to the single crystals, but with the orientation [100], 4A, on the interconnecting arrangement of the seam layer 2A. With the formation of the thin layer of e.g. YBCO film 4A on top of the interconnecting arrangement 2A having an orientation which is different from that of the main film representing that part of the film which is grown on top of the interconnecting arrangement 2A, a potential barrier is created for electrons and Cooper pairs, i.e. a Josephson junction is formed. Reference numeral 6 indicates the superconducting film as a whole. It is in this embodiment referred to an YBCO film but of course this merely constitutes an example. A number of different alternatives are also possible for the film such as e.g. $BiSrCaCuO_2$, $TlBiSrCaCuO_2$, $HgBiSrCaCuO_2$, etc. Moreover, in this particular embodiment the interconnecting arrangement or the seam layer 2A and the deposited film 6 are both made of the same material. This relates to one particular embodiment, they may as well be of different materials of which a number of examples have been mentioned already. This relates to both the interconnecting arrangement 2A and to the deposited film 3A,4A. It is also possible to use other materials than the ones mentioned.

In testing, a test sample with an YBCO barrier as referred to the above (tilted 90 degrees) produced a critical current depression of about four orders of magnitude whereas a test sample comprising two [001] $NdGaO_3$ crystals connected through a 45 degree tilt grain boundary created a barrier with a maximum critical current depression of three orders of magnitude.

Each crystal boundary in the interconnecting arrangement or the seam layer 2A will be inherited by the deposited film 3A,4A. In the embodiment described above the barrier thickness will be increased. Generally less current flows in a thicker barrier. Thus the transportation of current can be changed and controlled by changing the barrier thickness.

Figure 2A:
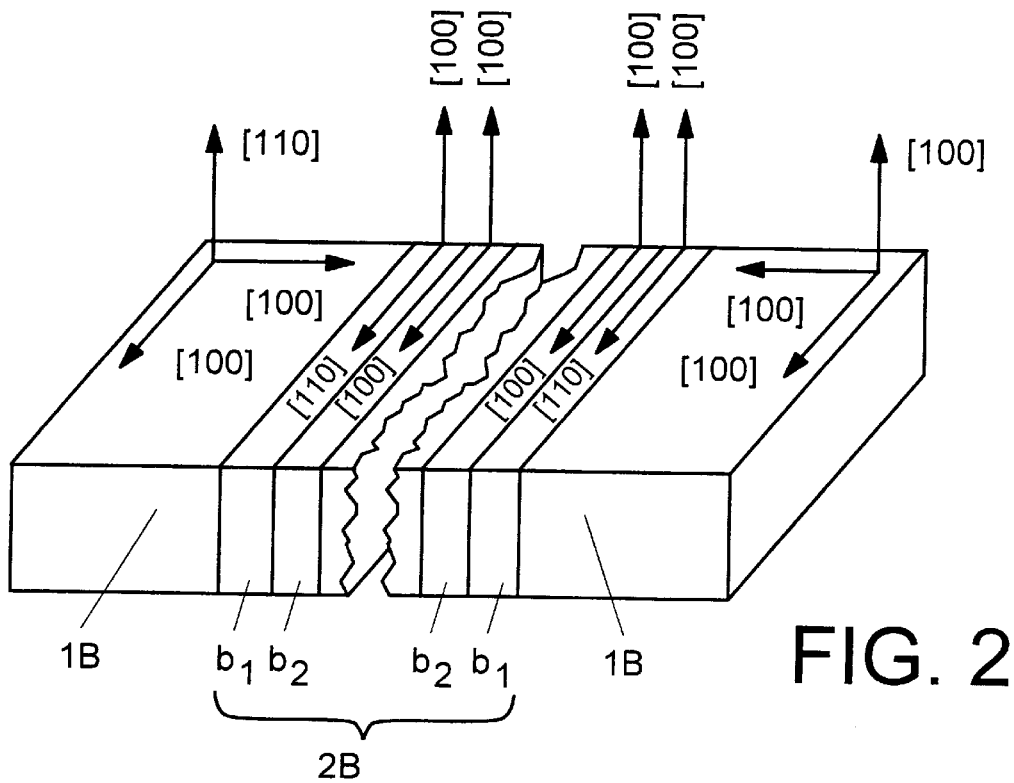
FIG. 2a illustrates an embodiment of a substrate comprising two single crystals interconnected through an interconnecting layer comprising a number of sublayers.

In FIG. 2a another embodiment of a substrate is illustrated. The substrate as described comprises two single crystals 1B,1B; here the single crystals 1B,1B are e.g. of Y—$ZrO_2$ (or YSZ). Also in this embodiment a number of other materials can be used, the only condition really being that they are appropriate for growth of thin, particularly high $T_c$, superconducting films thereon. The interconnecting layer can generally be formed by depositions on the end-member or by fusing thin slabs together or a combination of both. Also in this embodiment the dimensions can be taken to 5×10×0.5 millimeters, the values naturally only constituting examples. The single crystals 1B,1B are interconnected through an interconnecting arrangement 2B. In this embodiment the interconnecting arrangement or the seam layer comprises a number of layers $b_1, b_2, \ldots$ which are deposited on the polished sides of the single crystals 1B,1B. These layers can be said to form a multilayer seam 2B. In the shown embodiment the interconnecting arrangement or the multilayer seam 2B comprises five first layers $b_1$, of a first material, and four second layers $b_2$, of a second material. In the illustrated embodiment the first layers $b_1$ comprise $SrTiO_3$ whereas the second layers $b_2$ may be of the same material as the substrate or the single crystals 1B,1B; in this case Y—$ZrO_2$. This is of course merely given as an example, and the second layer $b_2$ does not have to be of the same material as the single crystals 1B,1B but it can be of still another material, it merely being important or relevant that each layer is different from the neighbouring layers. This can be achieved through the use of a number of layers each being of a different material or just a few of them being of different materials or through the alternation of e.g. two layers. The important factor is that a weak link or a Josephson junction corresponds to each boundary between different materials or differently oriented materials or both. An important factor is that the materials as such do not have to be different but then the orientations have to differ. The crystallographic orientations of the single crystals 1B and the sublayers of the interconnecting arrangement 2B are illustrated by brackets in FIG. 2a. In this particular embodiment the thickness of each sublayer (or some of the sublayers) is e.g. 555 nm and the total seam thickness or the thickness of the interconnecting arrangement 2B is 5 μm. These figures are merely given as examples. The sublayers can also have different thicknesses, advantageously the sublayers may have a thickness of the order of 1 μm.

Figure 2B:
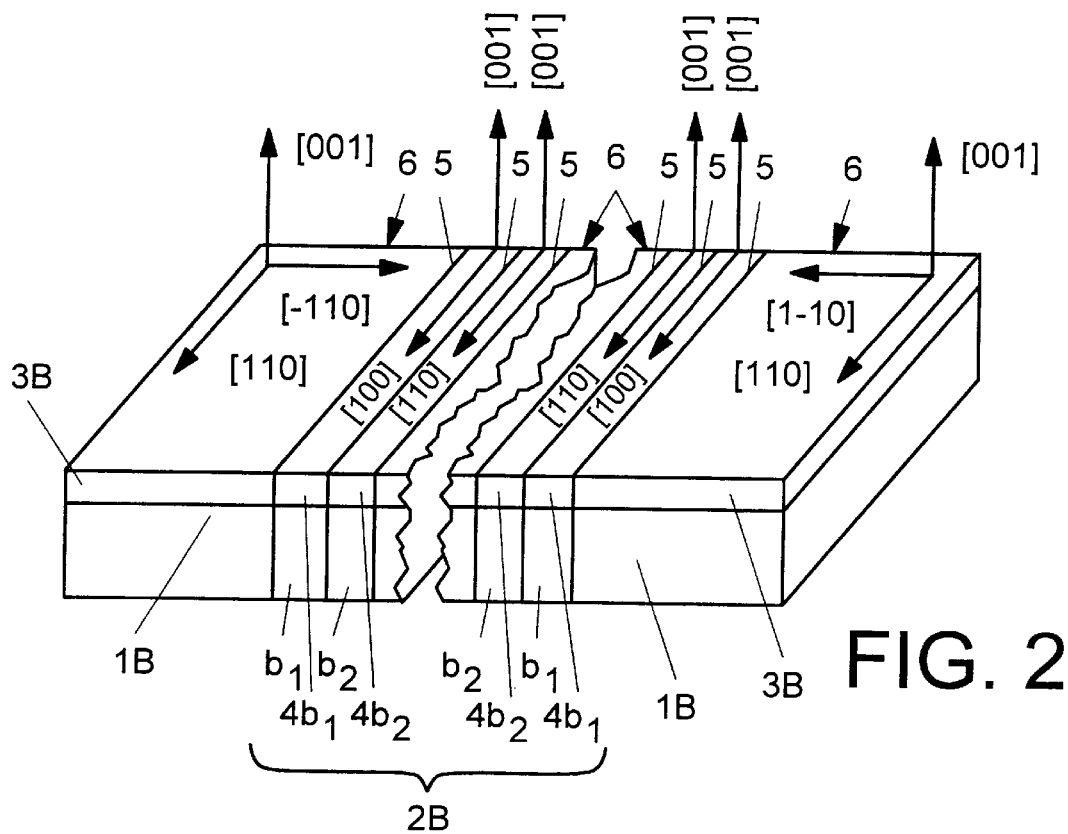
FIG. 2b illustrates the substrate of FIG. 2a with the HTS-film deposited thereon.

In FIG. 2b a thin superconducting film 6 is grown on to the substrate. The film 3B is grown with the respective orientations for that part of the film on the single crystal part 1B and on the interconnecting arrangement part 2B of this seam layer parts comprised therein of the substrate as illustrated in FIG. 2b within brackets. Each boundary between the layers of the substrate is inherited as a 45 degrees grain boundary 5 in the deposited film 3B,4B. In this illustrated embodiment 10 parallel 45 degrees tilted grain boundaries 555 nm apart are formed in the YBCO film. This grain boundary superlattice represents a complex boundary of ten weak links or ten Josephson junctions in series or a multibarrier superlattice. The thicknesses of the layers, the materials, the number of materials etc. are merely given as examples. In an embodiment of this kind the number of barriers in the film are increased. The number of layers can be different, e.g. from two up to more than ten or similar. The layers may e.g. be deposited by laser deposition or similar. The device described in the embodiment corresponding to FIGS. 2a and 2b has closely spaced junctions. The spacing between them may e.g. be about 10–2000 nm and they are connected in series. In this way an internal interaction can be obtained. With the described device it is possible to make e.g. electronic devices, such as e.g. microwave-generators and devices working at high frequencies. In one application the closely spaced junctions, which can be synchronized, may work as one junction having considerably better parameters than the corresponding "one" junction and having a better $I_cR_n$-product. This product is the critical current times the normal resistivity, i.e. the resistivity under normal conditions.

Consequently, in the shown embodiments a two-dimensional structure of Josephson junctions or weak links is obtained since the Josephson junctions inherit the grain boundary of the substrate which then may be called a multi-bicrystalsubstrate. Then e.g. highly integrated two-dimensional circuit structures can be fabricated.

Figure 3A:
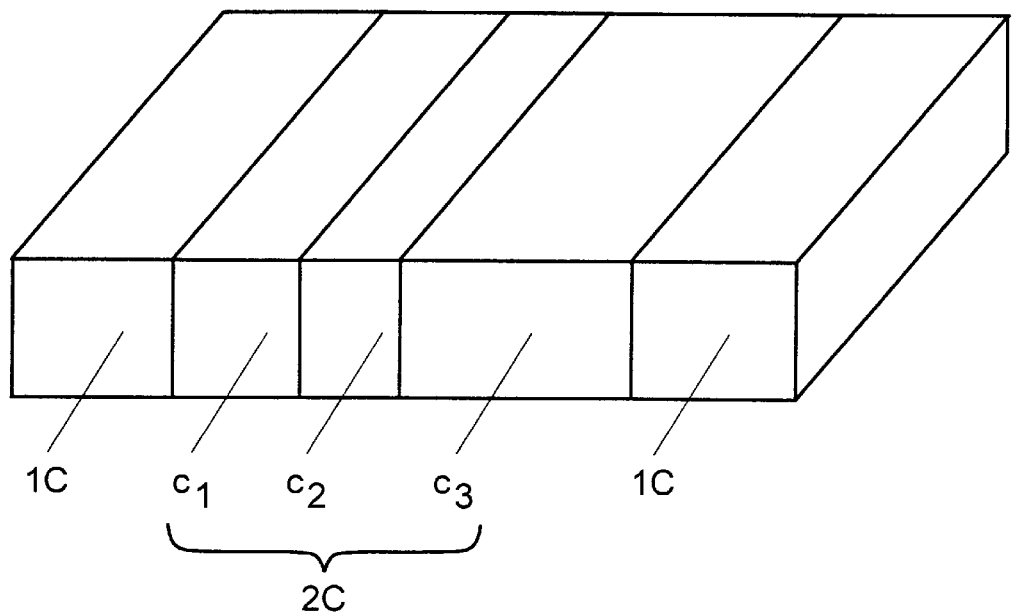
FIG. 3a illustrates an embodiment of a substrate wherein the interconnecting arrangement comprises layers grown onto the single crystal.
Figure 3B:
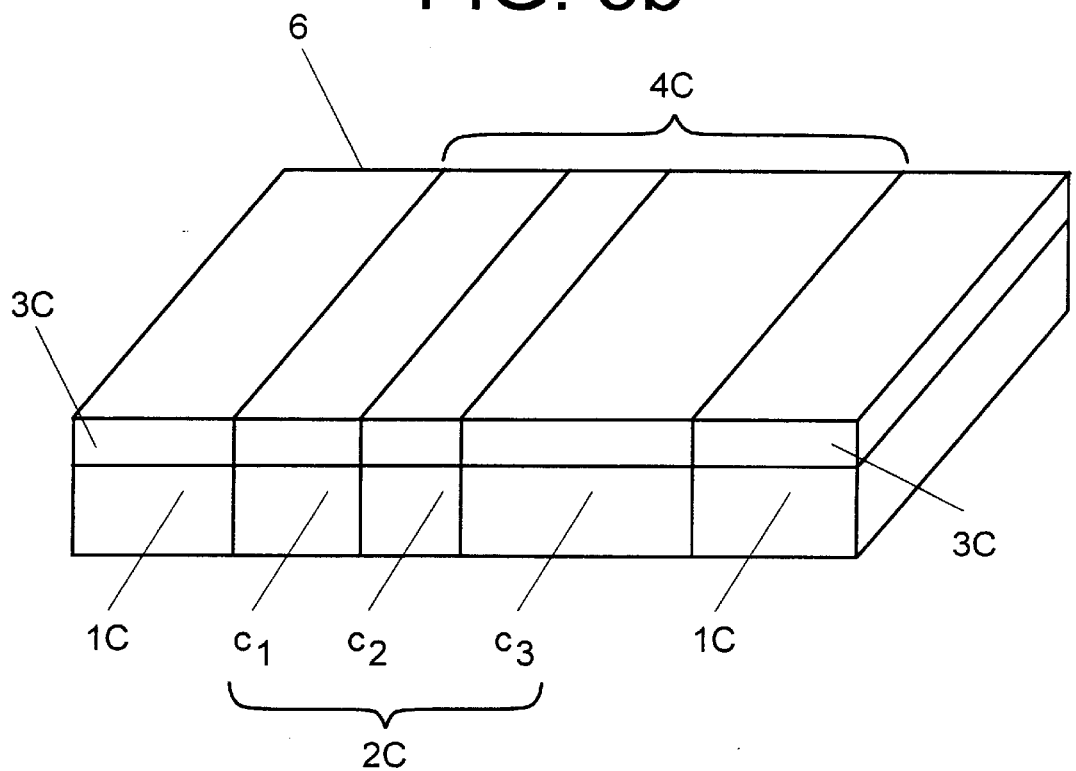

In FIG. 3a a substrate is illustrated which comprises a single crystal 1C onto which an interconnecting arrangement 2C is grown. In this case the interconnecting arrangement 2B comprises e.g. crystals which are grown onto the single crystal 1C and then polished to obtain the desired thickness whereafter still a further crystal is grown on to the preceding one, then polished etc. In the shown embodiment an interconnecting arrangement comprising three sublayers $c_1$, $c_2$, $c_3$ is illustrated. These layers $c_1,c_2,c_3$ are generally thicker than the layers described in relation to the embodiments described above. Preferably the material of the layers of the interconnecting arrangement 2C is of the same material as the single crystals 1C but having a different crystal orientation. Of course it is also possible to use another material. The growth of the intermediate layers or sublayers is determined by the single crystals 1C,1C. The materials of the single crystals 1C,1C can be the same as discussed above in relation to the other embodiments. In FIG. 3b a superconducting film is grown onto the substrate. In the embodiment described herein the distance between the grains may be about 10 to 15 nm, but this is merely given as an example. The meaning of the reference numerals corresponds to that of the previous embodiments.

In a particular embodiment electrodes my be arranged and e.g. connect the junctions of the device described in FIG. 3a and 3b.

It is e.g. possible to connect circuits which are connected in series etc. The slabs are particularly convenient for the arrangement of electrodes etc. for forming circuits.

The deposition of the film 6 or 3A,4A,3B,4B,3C,4C can be carried out with generally every known method. Examples thereof are laser deposition, magnetron scattering, CO-evaporation, chemical vapour deposition (CVD) or Molecular Beam Epitaxy, MBE.

The embodiment in which the layers of the interconnecting arrangement 2C are grown on to the single crystals 1C, could e.g. be used for digital applications.

The invention shall of course not be limited to the shown embodiments but can be varied in a number of different ways.

What is claimed is:

1. A device providing weak links in a superconducting film comprising a substrate which comprises single crystals and an interconnecting arrangement consisting of one or more monocrystalline films or single crystal slabs and arranged between the single crystals for interconnecting the single crystals, at least a first surface of each of the single crystals and a first surface of the interconnecting arrangement comprises a number of seam-sublayers, each sublayer being different from an adjacent sublayer/single crystal, and the interconnecting arrangement comprises a limited number of sublayers forming a barrier having a thickness substantially corresponding to that of the interconnecting arrangement and wherein at least two grain boundaries, connected in series perpendicularly to the interconnecting arrangement, are formed in the substrate.

2. A device as in claim 1, wherein the interconnecting arrangement comprises a number of seam-sublayers wherein the orientation of the material of each sublayer differs from that of surrounding, adjacent sublayers.

3. A device as in claim 1, wherein each sublayer is different from neighbouring sublayers and/or single crystals and wherein n sublayers are arranged forming n+1 parallel grain boundaries.

4. A device as in claim 1, wherein the interconnecting arrangement comprises several sublayers of at least two different materials arranged in an alternating manner to form a superlattice.

5. A device as in claim 4, wherein the number of sublayers is between about 3 and 9.

6. A device as in claim 1, wherein the layers of the interconnecting arrangement are arranged through deposition.

7. A device as in claim 1, wherein the single crystals are made of Y—$ZrO_2$.

8. A device as in claim 1, wherein the single crystals are made of $SrTiO_3$, MgO, $NdGaO_3$, or sapphire.

9. A device as in claim 7, wherein the interconnecting arrangement comprises an YBCO-film.

10. A device as in claim 8, wherein the interconnecting arrangement comprises an YBCO-film.

11. A device as in claim 7, wherein the interconnecting arrangement comprises at least one film of $BiSrCaCuO_2$, $TlBiSrCaCuO_2$, $HgBiSrCaCuO_2$.

12. A device as in claim 8, wherein the interconnecting arrangement comprises at least one film of $BiSrCaCuO_2$, $TlBiSrCaCuO_2$, $HgBiSrCaCuO_2$.

13. A device as in claim 1, wherein thin sublayers are connected in series and tilted 45 degrees.

14. A device as in claim 1, wherein at least one sublayer is grown on to a single crystal, said sublayer comprising the same material as the single crystal but having a different orientation, and being polished to have a given thickness.

15. A device as in claim 14, wherein a number of sublayers are grown on to each other to form a number of sublayers wherein each sublayer has a thickness of about approximately 10 to 15 $\mu$m, each boundary between differently oriented materials forming a grain boundary.

16. A device as in claim 1, wherein a superconducting film is deposited on one of the common plane and an upper surface.

17. A device as in claim 16, wherein the superconducting film is a high temperature superconducting (HTS) film.

18. A device as in claim 17, wherein at least two grain boundaries of the substrate are parallel, the grain boundaries of the substrate being inherited to the superconducting film thus forming weak links therein.

19. A device comprising weak links which comprises a substrate of the single crystals interconnected via an interconnecting arrangement and a superconducting film deposited thereon wherein the interconnecting arrangement comprises a number of layers wherein at least one barrier is formed in the substrate which is inherited to the superconducting film, wherein the interconnecting arrangement comprises a number of seam-sublayers, each sublayer being different from adjacent sublayer/single crystal, a limited number of sublayers forming a barrier having a thickness substantially corresponding to that of the interconnecting arrangement.

20. A device as in claim 19, wherein the substrate has a superlattice structure which is inherited as a multibarrier superlattice by the deposited superconducting film.

21. A device as in claim 19, wherein the superconducting film comprises a high temperature superconducting material (HTS).

22. A device comprising Josephson junctions wherein a superconducting film is deposited on a substrate in which single crystals are interconnected via an interconnecting arrangement arranged between the single crystals wherein the single crystals and the interconnecting arrangement are so arranged that at least two grain boundaries are inherited to the superconducting film so that a structure of Josephson junctions arranged in two dimensions is obtained, and the interconnecting arrangement comprises a number of seam-sublayers, each sublayer being different from adjacent sublayer/single crystal, a limited number of sublayers forming a barrier having a thickness substantially corresponding to that of the interconnecting arrangement.

23. An integrated circuit comprising a substrate and single crystals disposed on the substrate and interconnected via an interconnecting arrangement, arranged between the single crystals, and a superconducting film deposited thereon wherein the interconnecting arrangement comprises a number of layers wherein at least two grain boundaries with a Josephson junction connected in series in a direction perpendicularly to that of the interconnecting arrangement are formed in the substrate which is inherited to the superconducting film, and the interconnecting arrangement comprises a number of seam-sublayers, each sublayer being different from adjacent sublayer/single crystal, a limited number of sublayers forming a barrier having a thickness substantially corresponding to that of the interconnecting arrangement.

24. The integrated circuit of claim 23, wherein the superconducting film is an HTS-film.

25. The integrated circuit of claim 23, comprising a weak link in the superconducting film.

26. In a device as in claim 6 wherein the deposition is laser deposition.

* * * * *